(12) United States Patent
Liu et al.

(10) Patent No.: US 8,993,378 B2
(45) Date of Patent: Mar. 31, 2015

(54) FLIP-CHIP BGA ASSEMBLY PROCESS

(75) Inventors: Yu-Chih Liu, Taipei (TW); Jing Ruei Lu, Taipei (TW); Wei-Ting Lin, Taipei (TW); Sao-Ling Chiu, Hsinchu (TW); Hsin-Yu Pan, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 711 days.

(21) Appl. No.: 13/225,614

(22) Filed: Sep. 6, 2011

(65) Prior Publication Data

US 2013/0059416 A1 Mar. 7, 2013

(51) Int. Cl.
| | |
|---|---|
| *H01L 21/50* | (2006.01) |
| *H01L 23/00* | (2006.01) |
| *H01L 23/498* | (2006.01) |
| *H01L 21/683* | (2006.01) |

(52) U.S. Cl.
CPC ............... *H01L 21/50* (2013.01); *H01L 24/75* (2013.01); *H01L 24/81* (2013.01); *H01L 23/49816* (2013.01); *H01L 24/16* (2013.01); *H01L 2224/75701* (2013.01); *H01L 2224/81011* (2013.01); *H01L 24/13* (2013.01); *H01L 21/6836* (2013.01); *H01L 2221/68327* (2013.01); *H01L 2221/68381* (2013.01); *H01L 2224/1601* (2013.01); *H01L 2224/7565* (2013.01); *H01L 2224/81143* (2013.01); *H01L 2224/81191* (2013.01); *H01L 2224/81815* (2013.01); *H01L 2224/94* (2013.01); *H01L 2224/131* (2013.01)

USPC .................................. 438/108; 257/E21.499

(58) Field of Classification Search
None
See application file for complete search history.

(56) References Cited

U.S. PATENT DOCUMENTS

| | | | |
|---|---|---|---|
| 5,658,827 | A | 8/1997 | Aulicino et al. |
| 6,117,759 | A | 9/2000 | Greer et al. |
| 6,429,530 | B1 | 8/2002 | Chen |
| 6,484,927 | B1 | 11/2002 | Adriance et al. |
| 2003/0205799 | A1 | 11/2003 | Yunus |
| 2010/0101845 | A1 * | 4/2010 | Kishi et al. ..................... 174/259 |

FOREIGN PATENT DOCUMENTS

CN 1254185 A 5/2000

* cited by examiner

*Primary Examiner* — Seahvosh Nikmanesh
(74) *Attorney, Agent, or Firm* — Duane Morris LLP

(57) ABSTRACT

A method for assembling a flip chip ball grid array package includes mounting solder spheres to a ball grid array substrate, applying flux to a plurality of flip chip solder bumps provided on a diced wafer, aligning the ball grid array substrate over a chip on the diced wafer, picking and separating the chip from the diced wafer by urging the chip upwards towards the ball grid array substrate until the flip chip solder bumps on the chip come in contact with the ball grid array substrate, whereby the chip attaches to the ball grid array substrate in an upside-down orientation, and subjecting the chip and the ball grid array substrate to a thermal process whereby the solder spheres reflow and form solder balls and the flip chip solder bumps reflow and form solder joints between the chip and the ball grid array.

14 Claims, 6 Drawing Sheets

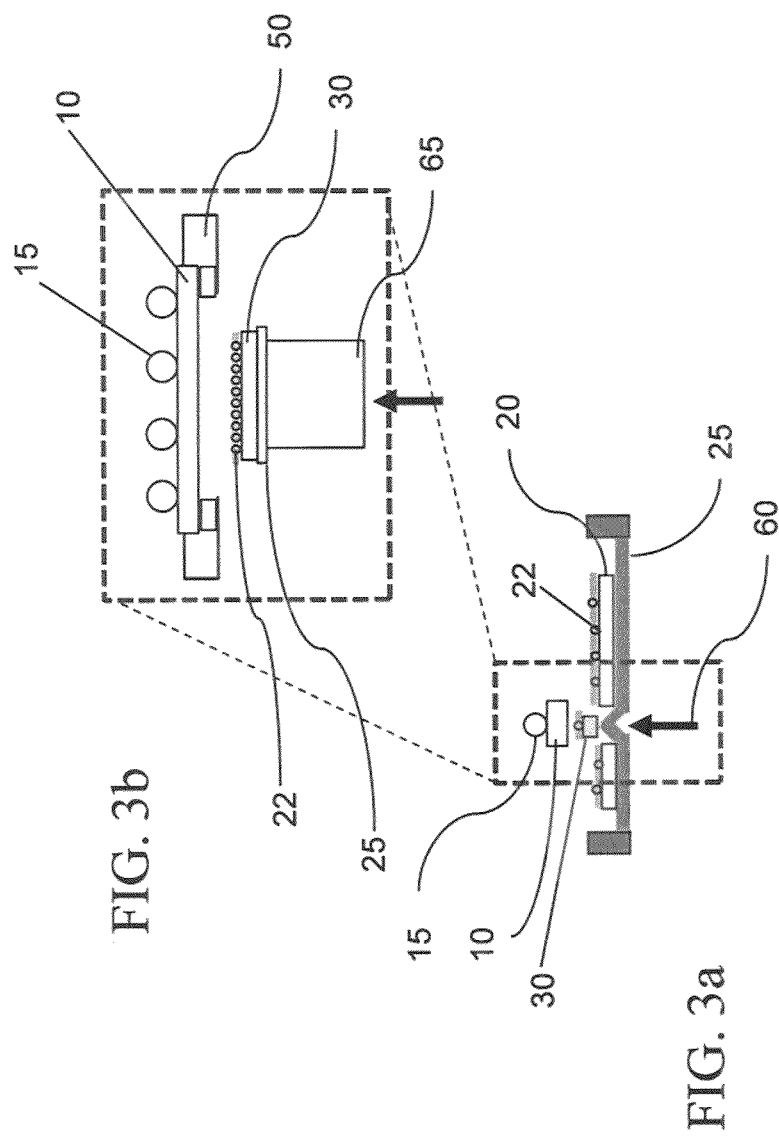

FLIP-CHIP BGA ASSEMBLY PROCESS

FIELD

The disclosed subject matter generally relates to flip chip ball grid array packaging assembly process.

BACKGROUND

Generally, a flip chip ball grid array (FCBGA) assembly process involves preparation of a BGA substrate and a flip chip component and joining them together via the flip chip component's flip chip solder bumps to form the final FCBGA package. In a conventional FCBGA packaging assembly process, the package assembly is subjected to a number of high temperature thermal cycles in connection with reflowing of the BGA solder balls and the flip chip component's solder burns. But, because each high temperature thermal cycle adds some level of stress on the device as well as extending the overall process cycle time, it is desirable to limit the number of high temperature thermal cycles. In most conventional FCBGA assembly process, the FCBGA package assembly is processed through at least two high temperature thermal cycles: one solder reflow cycle for forming the BGA solder balls on the BGA substrate and a second reflow cycle for reflowing the flip chip component's solder bumps to form the flip chip solder joints between the flip chip component and the BGA substrate.

BRIEF DESCRIPTION OF THE DRAWINGS

FIG. 3a shows the BGA substrate being aligned over a desired chip on the diced wafer and the chip being picked and attached to the BGA substrate.

FIG. 3b is a close up view of the area outlined by a dotted line in FIG. 3a.

Figure 2:
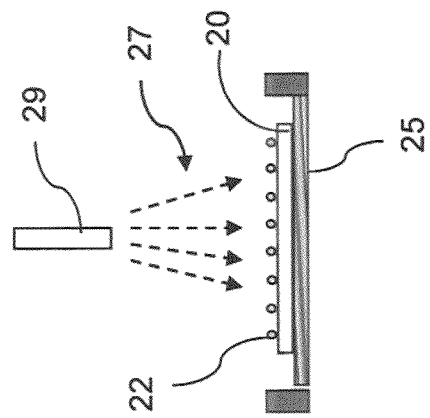
FIG. 2 shows a flux being applied to the flip chip solder bumps on the device side of a diced wafer.

All drawings are schematic and are not to scale.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 1:
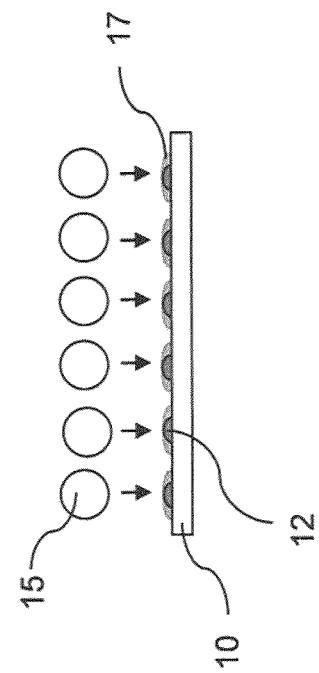
FIG. 1 shows a process step in which solder spheres are being mounted on to a BGA substrate.

This disclosure describes an FCBGA assembly process that reduces and simplifies the overall assembly process by forming the BGA solder balls and the flip chip solder joints in one solder reflow cycle. The FCBGA assembly process according to the present disclosure will be described with reference to FIGS. 1 through 6. FIG. 1 shows a process step in which solder spheres 15 are mounted on to a BGA substrate 10. The BGA substrate 10 is provided with an array of BGA pads 12 on to which the solder spheres 15 are mounted. Generally, a flux 17 is applied on the BGA pads 12 to aid in the wetting of the solder spheres 15 during the subsequent solder sphere reflow process. The particular flux 17 composition will depend on the composition of the solder spheres 15 and the present disclosure does not limit the compositions of the solder spheres 15 and the flux 17 to any particular set of materials. They can be any of the materials well-known in the art for these applications.

FIG. 2 shows a process step in which the flip chip components are being prepared. The flip chip components are fabricated in large numbers in wafer form as in the case of most semiconductor integrated circuit devices. The wafers are then diced to separate the individual flip chip components. Although, the flip chip components are predominantly semiconductor devices, components such as passive filters, detector arrays, and MEMs devices also can be provided in flip chip form. When the wafer is being diced, a dicing tape 25 is applied to the backside (the side opposite from the device side) of the flip chip component wafer 20 in order to keep the flip chip components together until they are picked for subsequent processing. At this stage, flip chip solder bumps 22 have already been formed on the device side of the wafer 20. In this disclosure, the terms "die" and "chip" are used interchangeably to refer to a flip chip component.

In the process step illustrated in FIG. 2, a second flux 27 is applied to the flip chip solder bumps 22 on the diced wafer 20. The second flux 27 can be the same material as the first flux 17 or different but it is dependent upon the solder composition of the flip chip solder bumps 22. The second flux 27 can be applied using an appropriate method such as a jet spray 29. Mounting the solder spheres on to the BGA substrate and applying the second flux 27 to the flip chip solder bumps 22 can be performed in any order as long as they are completed before the next step.

Next, the BGA substrate 10 with the solder spheres 15 mounted on one side is aligned over one of the flip chip components, herein after called a chip 30, on the diced wafer 20 as shown in FIG. 3a. The BGA substrate 10 is oriented with the side with the solder spheres 15 mounted thereon facing up and the other side, the flip chip component receiving side, facing toward the chip 30 as shown. The chip 30 is then picked and attached to the BGA substrate 10.

Unlike the conventional die picking process in which a vacuum head picks up a die from the diced wafer by contacting the side of the chip 30 with the flip chip solder bumps, in the die picking process of the present method, the chip 30 is separated from the diced wafer 20 by urging the chip upwards towards the BGA substrate 10 from the bottom side, the taped side, of the diced wafer 20. This picking and attaching operation is represented by the arrow 60.

Referring to a detailed close-up view shown in FIG. 3b, the picking and attaching of the chip 30 is accomplished by the use of a die pickup pin 60. The die pickup pin 60 pushes the chip 30 toward the BGA substrate 10 until the flip chip solder bumps 22 come in contact with the BGA substrate 10. Once the flip chip solder bumps 22 contact the BGA substrate 10, the chip 30 attaches to the BGA substrate 10 and is held in place in the solder-bumps-up orientation by the surface tension of the second flux 27.

According to another embodiment, a method for assembling a flip chip ball grid array package comprises mounting a plurality of solder spheres to a ball grid array substrate, applying a flux to a plurality of flip chip solder bumps provided on a diced wafer, aligning the ball grid array substrate over a chip on the diced wafer, and picking the chip from the diced wafer by urging the chip upwards towards the ball grid array substrate until the chip separates from the diced wafer and the flip chip solder bumps on the chip come in contact with the ball grid array substrate, whereby the chip remains attached to the ball grid array substrate in a solder-bumps-up orientation by the flux. After the chip is attached to the ball grid array substrate, the interim assembly is subjected to a thermal process, whereby the solder spheres reflow and form solder balls and the flip chip solder bumps reflow and form solder joints between the chip and the ball grid array substrate.

According to another embodiment, a method for assembling a flip chip ball grid array package, wherein the ball grid array package comprises a chip joined to a ball grid array substrate is disclosed. The ball grid array substrate comprises a first side and a second side. The method comprises dicing a wafer, the wafer comprising a plurality of chips and each of the plurality of chips having a plurality of flip chip solder bumps provided thereon. Independent of the dicing step, a flux is applied to the plurality of flip chip solder bumps on the wafer. Next, the ball grid array substrate is aligned over a chip on the diced wafer. The chip is picked from the diced wafer and attached to the first side of the ball grid array substrate with the chip in a solder-bumps-up orientation. The second side of the ball grid array substrate has a plurality of solder spheres mounted thereon. After the chip is attached to the ball grid array substrate, the interim assembly is subjected to a thermal process, whereby the solder spheres reflow and form solder balls and the flip chip solder bumps reflow and form solder joints between the chip and the ball grid array substrate.

Figure 4:
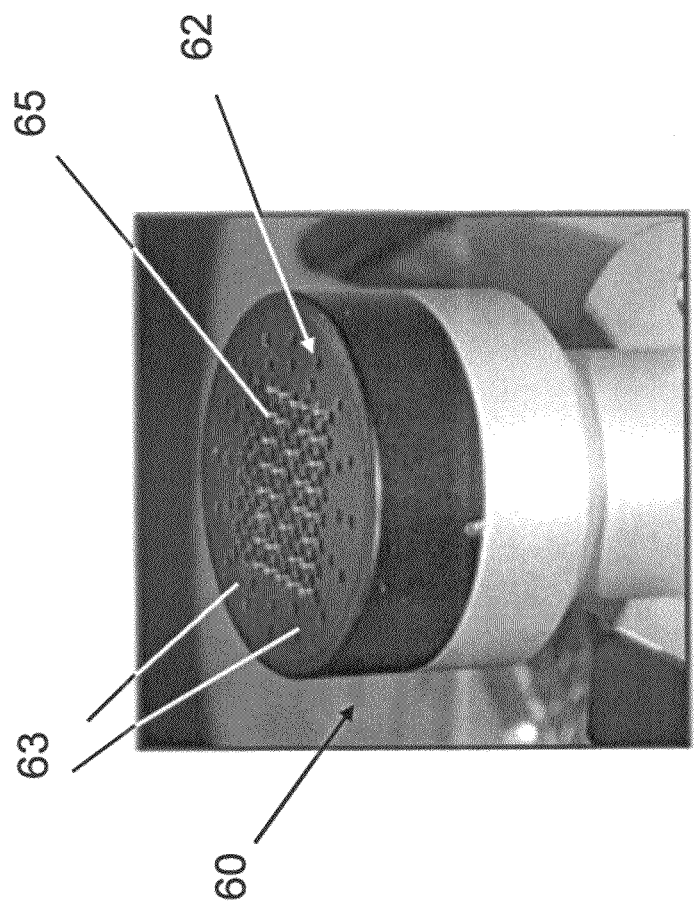
FIG. 4 shows the chip pick up pin used for the chip picking and attachment process of the present disclosure.

FIG. 4 shows an example of the die pickup pin 60. The die pickup pin 60 has a top surface 62 that is urged towards the chip 30. The top surface 62 is provided with a plurality of holes 63 and the die pickup pin 60 is configured with a plurality of push pins 65 that can be selectively extended through the holes 63 to form a pattern that is customized to the particular size and shape of the chip 30. The push pins 65 make the actual contact with the chip 30.

Figure 5:
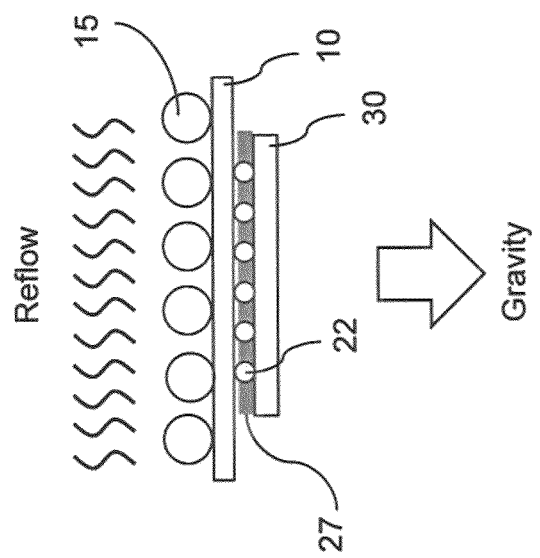
FIG. 5 shows the chip and the BGA substrate assembly in which the chip is attached to the bottom side of the BGA substrate in the "solder-bump-up" orientation and being reflowed according to the present disclosure.

Next, as shown in FIG. 5, the arrangement of the BGA substrate 10 and the chip 30 is subjected to a thermal process whereby the solder spheres 15 and the flip chip solder bumps 22 are reflowed simultaneously. The solder spheres form BGA solder balls and the flip chip solder bumps 22 form solder joints between the chip 30 and the BGA substrate 10. During the reflow step, because the chip 30 is in the solder-bumps-up orientation as shown.

As used herein, the "solder-bumps-up" orientation of the chip 30 refers to its orientation shown in FIG. 5 in which the BGA substrate 10 is oriented with the solder spheres 15 facing upwards and the flip chip solder bumps 22 of the chip 30 are contacting the BGA substrate 10 from the bottom side of the BGA substrate 10, i.e. the side opposite from the solder spheres 15. In this orientation, because the gravity pulls on the chip 30, the weight of the chip 30 puts the flip chip solder bumps 22 under tension during the reflow cycle, the solder bumps 22 are elongated during the reflow cycle and results in the solder joints being taller than the solder joints formed in conventional FCBGA assembly process. In the conventional orientation, the flip chip solder bumps are facing down in a solder-bump-down orientation and the weight of the chip puts the solder bumps under a compression during the solder bump reflow cycle. Thus, the FCBGA assembly process of the present disclosure produces taller flip chip solder joints.

Figure 6:
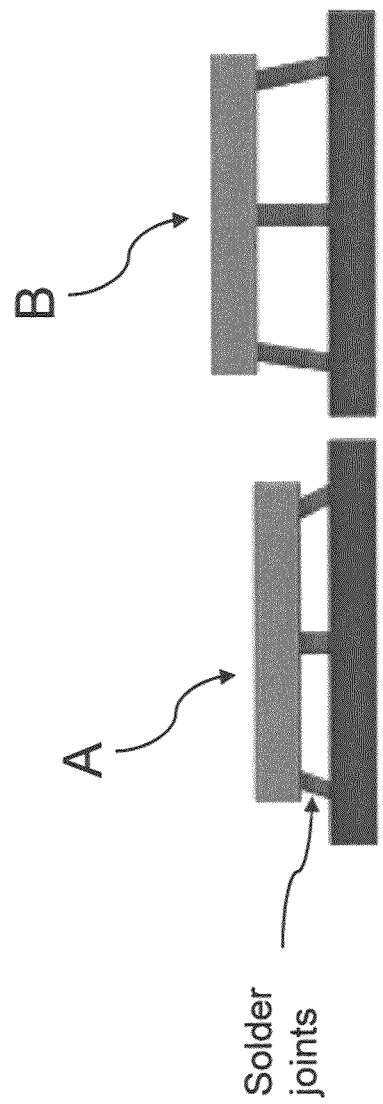
FIG. 6 shows two FCBGA packages having different flip chip solder joint heights.

The actual temperature profile for the thermal process will be determined by the solder composition of the solder spheres 15 and the flip chip solder bumps 22. The thermal process has a thermal profile that reaches a peak temperature sufficiently high to reflow the solder spheres 15 as the flip chip solder bumps 22. Where the solder spheres 15 and the flip chip solder bumps 22 are formed of the same solder composition, the peak temperature will be the one appropriate to reflow that solder composition. In some FCBGA packages, the solder spheres and the flip chip solder bumps may be formed from two different solder compositions having different melting temperatures. In such case, the peak temperature for the thermal process will be sufficiently high to reflow both solder compositions The taller flip chip solder joints is one of the benefits of the method of present disclosure. Taller solder joints enhance the solder joint mechanical reliability by increasing the cyclic fatigue life of the solder joints. Because the chip material and the BGA substrate material have different coefficients of thermal expansion (CTE), as the active circuits on the chip gets powered on and off during the lifetime use of the FCBGA package, the chip and the BGA substrates cycle through thermal excursions. This thermal cycling causes the chip and the BGA substrate to expand and contract by different amounts because of the difference in their CTEs. This generates cyclic stress that deforms or strains the flip chip solder joints and eventually causes the solder joints to fail due to fatigue fractures. However, for a given cyclic stress, the strain imposed on the solder joints will be reduced if the solder joint is taller. This is graphically illustrated in FIG. 6. FIG. 6 shows two FCBGA packages A and B. The flip chip solder joints in package B is taller than the solder joints in package A and thus will have lower solder joint strain although the chip material and the BGA substrate material are the same.

Figure 7:
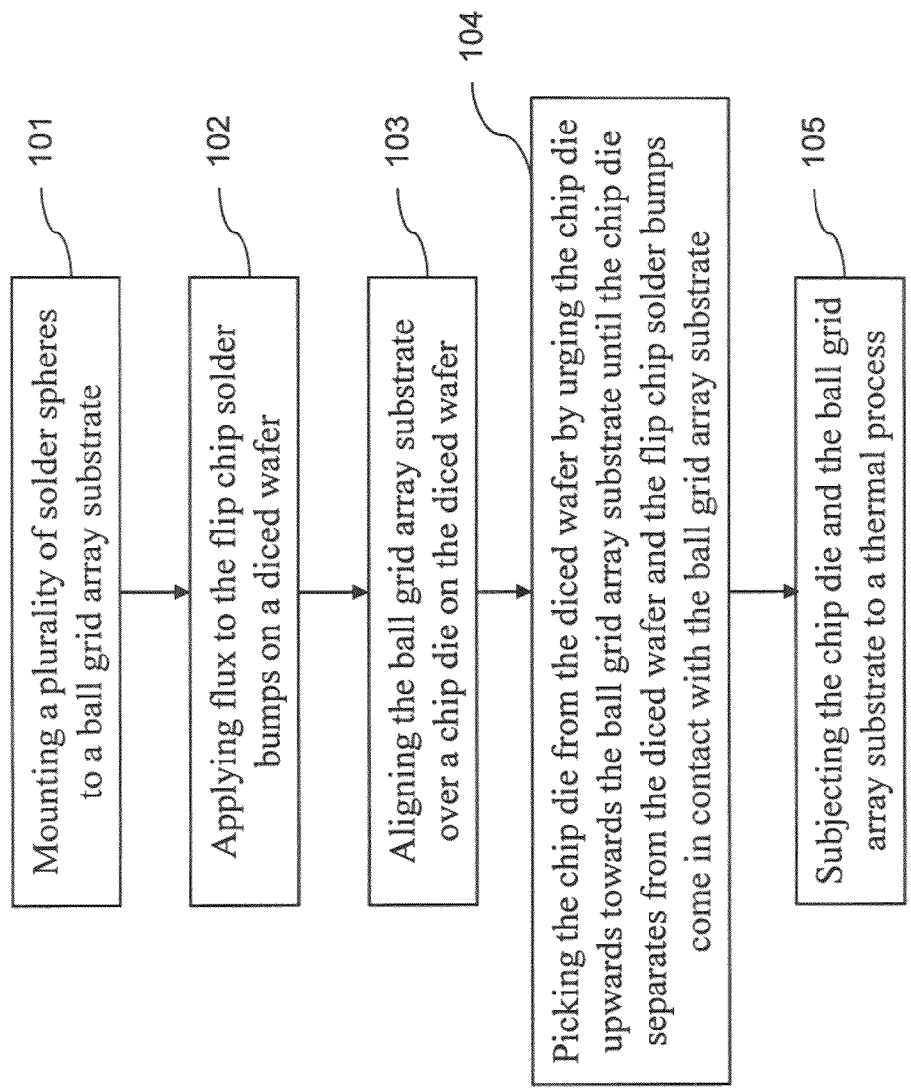
FIG. 7 is a flowchart illustrating the method according to an embodiment of the present disclosure.

FIG. 7 is a flowchart 100 outlining the method for assembling a flip chip ball grid array package according to the present disclosure. The ball grid array package comprises a flip chip and a ball grid array substrate having a first side and a second side. The method comprises mounting a plurality of solder spheres to the second side of the ball grid array substrate (see box 101); applying a flux to a plurality of flip chip solder bumps that are provided on a diced wafer (see box 102); aligning the ball grid array substrate over a chip on the diced wafer (see box 103); picking the chip from the diced wafer by urging the chip upwards towards the ball grid array substrate until the chip separates from the diced wafer; the chip is attached to the first side of the ball grid array substrate by further urging the chip until the flip chip solder bumps on the chip come in contact with the second side of the ball grid array substrate (see box 104), whereby the chip remains attached to the ball grid array substrate in a solder-bumps-up orientation; and subjecting the chip and the ball grid array substrate to a thermal process (see box 105), whereby the solder spheres reflow and form solder balls and the flip chip solder bumps reflow and form solder joints between the chip and the ball grid array substrate.

Additionally, the FCBGA assembly method of the present disclosure is a lower cost solution compared to the conventional assembly method because it requires only one solder reflow step to reflow both the flip chip solder bumps and the BGA solder spheres. Cost savings will be realized in both manufacturing process time and capital equipment. Because the "flip die" step is eliminated, the physical damage to the flip chip solder bumps associated with the flip die step is avoided. Furthermore, in the FCBGA assembly method of the present disclosure, the second flux 27 is sprayed on to the diced wafer 20, the chip flux dipping process of the conventional process is eliminated. This, in turn, eliminates the incidents of chips clinging to the flux dipping plate.

Although the subject matter has been described in terms of exemplary embodiments, it is not limited thereto. Rather, the appended claims should be construed broadly, to include other variants and embodiments, which may be made by those skilled in the art.

What is claimed is:

1. A method for assembling a flip chip ball grid array package, wherein the ball grid array package comprising a chip joined to a ball grid array substrate, the ball grid array substrate comprising a first side and a second side, the method comprising:
    picking the chip from a diced wafer by urging the chip upwards towards the ball grid array substrate, while the ball grid array substrate is being held over the chip, until the chip separates from the diced wafer, wherein the chip is in a solder bumps up orientation;
    attaching the chip to the first side of the ball grid array substrate by continuing to urge the chip until a plurality of flip chip solder bumps on the chip having a flux applied thereon come in contact with the ball grid array substrate, wherein the ball grid array substrate has a plurality of solder spheres mounted on the second side, whereby the chip attaches to the ball grid array substrate by the flux; and
    subjecting the chip and the ball grid array substrate to a thermal process, whereby the solder spheres reflow and form solder balls and the flip chip solder bumps reflow and form solder joints between the chip and the ball grid array substrate.

2. The method according to claim 1, further comprising the step of aligning the ball grid array substrate over the chip on the diced wafer before picking the chip from the diced wafer.

3. The method according to claim 2, further comprising the step of applying flux to a plurality of flip chip solder bumps that are provided on the diced wafer before the ball grid array substrate is aligned over the chip.

4. The method according to claim 3, further comprising the step of mounting a plurality of solder spheres to the ball grid array substrate before the ball grid array substrate is aligned over the chip.

5. The method according to claim 1, wherein the thermal process has a thermal profile that reaches a peak temperature sufficiently high to reflow the solder spheres and the flip chip solder bumps.

6. The method according to claim 5, wherein the solder spheres have a first solder composition having a first melting temperature and the flip chip solder bumps have a second solder composition having a second melting temperature that is different from the first melting temperature and the peak temperature for the thermal process is sufficiently high to reflow both solder compositions.

7. A method for assembling a flip chip ball grid array package, the method comprising:
    mounting a plurality of solder spheres to a ball grid array substrate;
    applying a flux to a plurality of flip chip solder bumps provided on a diced wafer;
    aligning the ball grid array substrate over a chip on the diced wafer;
    picking the chip from the diced wafer by urging the chip upwards towards the ball grid array substrate until the chip separates from the diced wafer and the flip chip solder bumps on the chip come in contact with the ball grid array substrate, whereby the chip remains attached to the ball grid array substrate in a solder-bumps-up orientation by the flux; and
    subjecting the chip and the ball grid array substrate to a thermal process, whereby the solder spheres reflow and form solder balls and the flip chip solder bumps reflow and form solder joints between the chip and the ball grid array substrate.

8. The method according to claim 7, wherein the thermal process has a thermal profile that reaches a peak temperature sufficiently high to reflow the solder spheres and the flip chip solder bumps.

9. The method according to claim 8, wherein the solder spheres have a first solder composition having a first melting temperature and the flip chip solder bumps have a second solder composition having a second melting temperature that is different from the first melting temperature and the peak temperature for the thermal process is sufficiently high to reflow both solder compositions.

10. A method for assembling a flip chip ball grid array package, wherein the ball grid array package comprising a chip joined to a ball grid array substrate, the ball grid array substrate comprising a first side and a second side, the method comprising:
    dicing a wafer, the wafer comprising a plurality of chips and each of the plurality of chips having a plurality of flip chip solder bumps provided thereon;
    applying a flux to the plurality of flip chip solder bumps;
    aligning the ball grid array substrate over a chip on the diced wafer;
    picking the chip from the diced wafer;
    attaching the chip to the first side of the ball grid array substrate with the chip in a solder-bumps-up orientation, and the ball grid array substrate has a plurality of solder spheres mounted on the second side, wherein the picking of the chip from the diced wafer and attaching the chip to the first side of the ball grid array substrate comprises urging the chip upwards towards the ball grid array substrate until the chip separates from the diced wafer and the flip chip solder bumps on the chip come in contact with the ball grid array substrate, whereby the chip remains attached to the ball grid array substrate in a solder-bumps-up orientation by the flux; and
    subjecting the chip and the ball grid array substrate to a thermal process, whereby the solder spheres reflow and form solder balls and the flip chip solder bumps reflow and form solder joints between the chip and the ball grid array substrate.

11. The method according to claim 10, wherein the thermal process has a thermal profile that reaches a peak temperature sufficiently high to reflow the solder spheres and the flip chip solder bumps.

12. The method according to claim 11, wherein the solder spheres have a first solder composition having a first melting temperature and the flip chip solder bumps have a second solder composition having a second melting temperature that is different from the first melting temperature and the peak temperature for the thermal process is sufficiently high to reflow both solder compositions.

13. The method according to claim 10, wherein the thermal process has a thermal profile that reaches a peak temperature sufficiently high to reflow the solder spheres and the flip chip solder bumps.

14. The method according to claim 13, wherein the solder spheres have a first solder composition having a first melting temperature and the flip chip solder bumps have a second solder composition having a second melting temperature that is different from the first melting temperature and the peak temperature for the thermal process is sufficiently high to reflow both solder compositions.

* * * * *